United States Patent [19]
Highton

[11] Patent Number: 4,591,805
[45] Date of Patent: May 27, 1986

[54] ADAPTIVE BANDWIDTH AMPLIFIER

[75] Inventor: Frederick J. Highton, Lynchburg, Va.

[73] Assignee: General Electric Company, Lynchburg, Va.

[21] Appl. No.: 615,232

[22] Filed: May 30, 1984

[51] Int. Cl.[4] .......................... H03F 1/34; H03G 3/20
[52] U.S. Cl. .................... 330/294; 330/278; 330/109
[58] Field of Search ............... 330/107, 109, 294, 302, 330/303, 304, 310, 278

[56] References Cited
U.S. PATENT DOCUMENTS

| | | |
|---|---|---|
| 2,969,459 | 1/1961 | Hern . |
| 3,217,257 | 11/1965 | Boatwright . |
| 3,786,363 | 1/1974 | Lelie ..................................... 330/107 |
| 3,909,725 | 9/1975 | Baghdady . |
| 4,502,017 | 2/1985 | Van de Plassche ................ 330/107 |

FOREIGN PATENT DOCUMENTS

| | | | |
|---|---|---|---|
| 0073511 | 5/1982 | Japan ................................. | 330/149 |
| 864515 | 4/1957 | United Kingdom . | |
| 856892 | 6/1958 | United Kingdom . | |
| A2134733 | 8/1984 | United Kingdom . | |
| A2140235 | 11/1984 | United Kingdom . | |

Primary Examiner—James B. Mullins
Assistant Examiner—G. Wan
Attorney, Agent, or Firm—Nixon & Vanderhye

[57] ABSTRACT

An amplifier exploits Miller-effect capacitance in a cascaded multi-stage self-limiting amplifier arrangement to achieve automatic adaptive bandwidth behavior (without the use of an active feedback control loop). The Miller-effect capacitance varies in accordance with the amplifier signal-level, with the capacitance in turn varying the amplifier bandwidth. Bandwidth is decreased for low-signal-levels and increased for relatively high-signal-levels. The adaptive amplifier technique is especially useful to reduce broadband noise in an IF stage of a communications device before the usable signal is fed to a detector stage.

18 Claims, 11 Drawing Figures

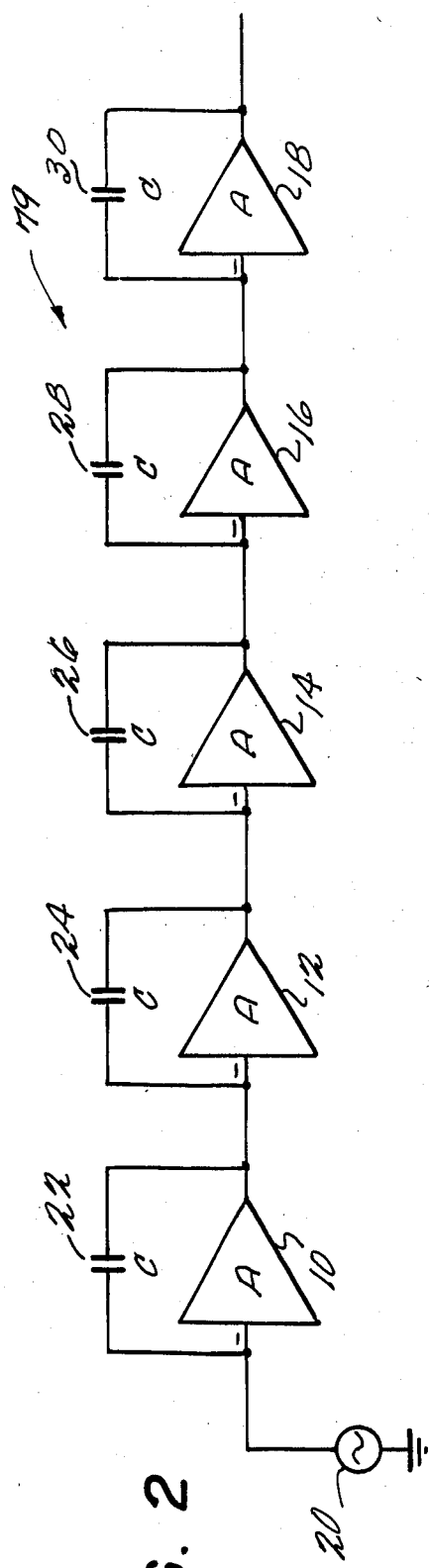
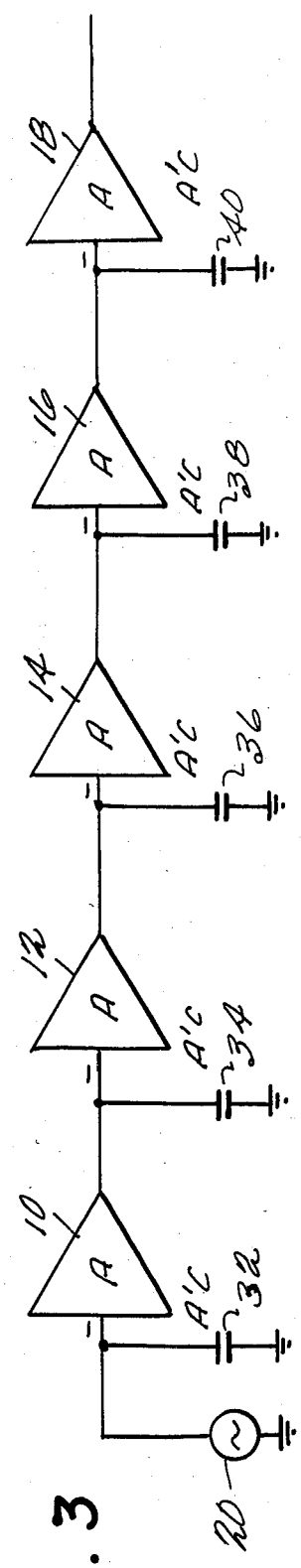
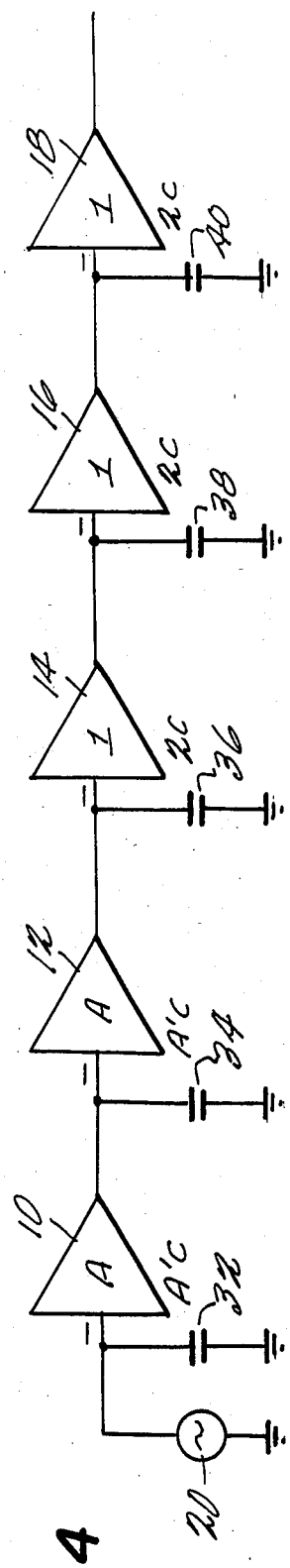
F I G. 2
F I G. 3
F I G. 4

FIG. 5
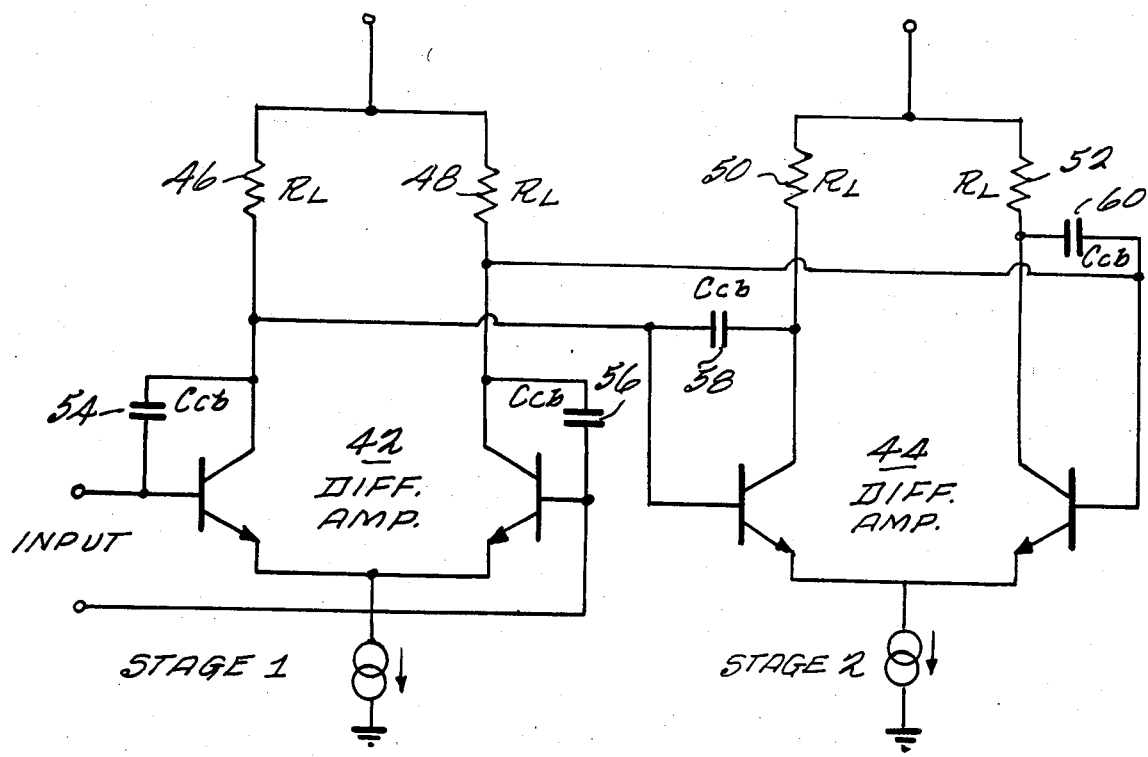
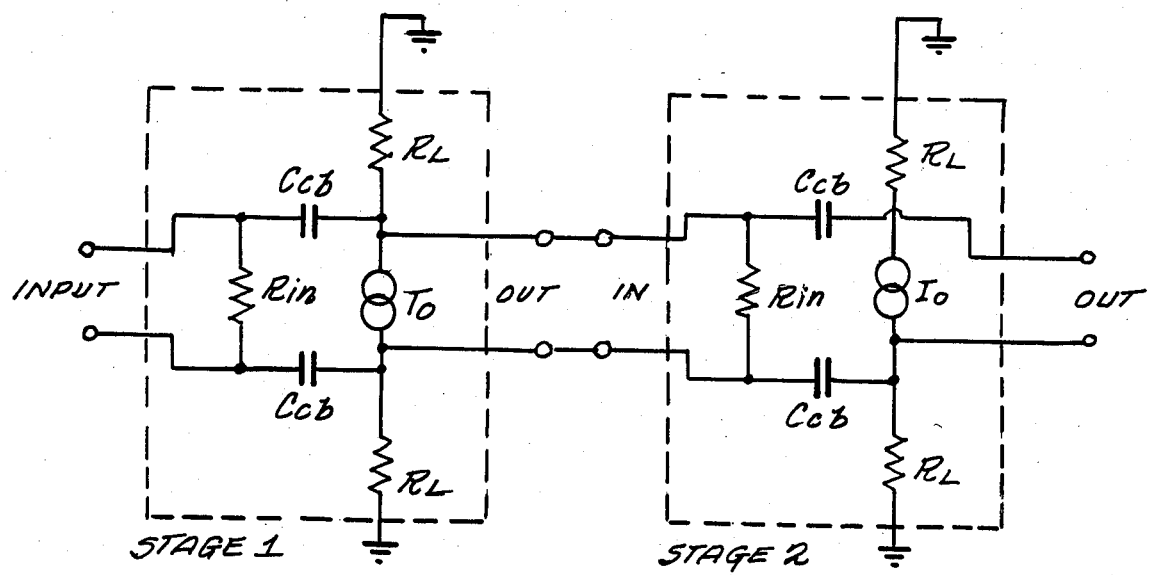
FIG. 7

FIG. 7
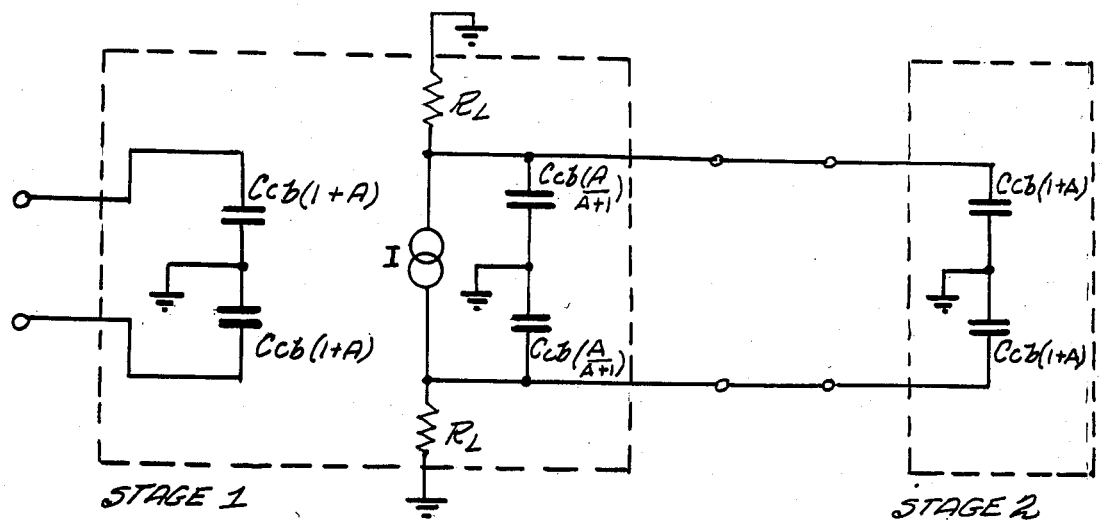
FIG. 8
FIG. 9
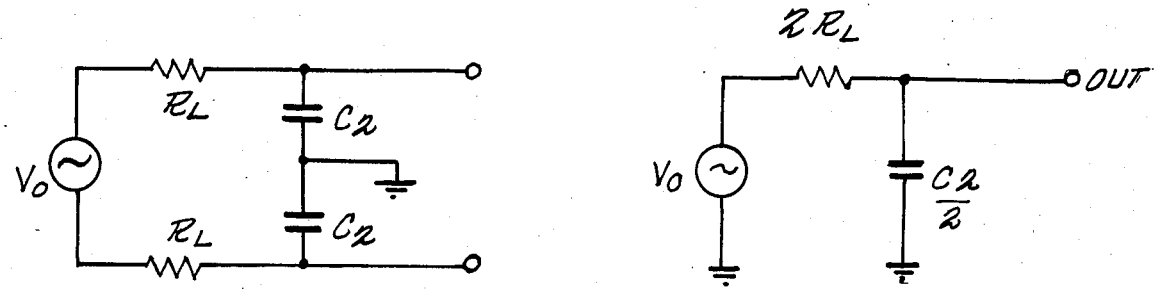
FIG. 10
FIG. 11
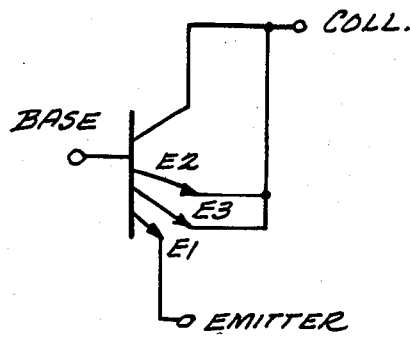
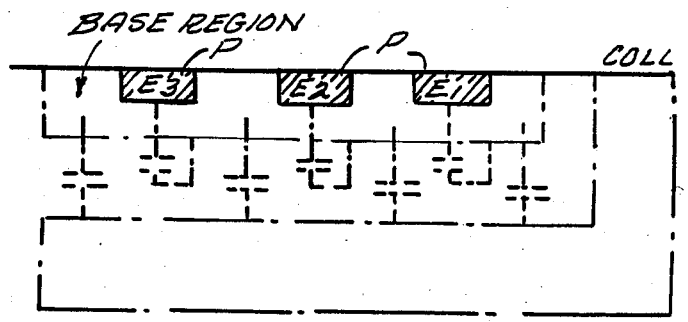

ADAPTIVE BANDWIDTH AMPLIFIER

The present invention is concerned with an adaptive bandwidth amplifier. Specifically, the present invention addresses the problem of broadband noise typically associated with the last integrated circuit IF (intermediate frequency) amplifier stage of a radio communication receiver (e.g. cellular radio device). The signal-to-noise ratio (S/N) of the amplified signal presented to a detector circuit is improved through an automatic signal level sensitive adaptive amplifier bandwidth for the last IF amplifier stage using a cascaded chain of self-limiting amplifiers, each having enhanced "Miller" effect input capacitance.

BACKGROUND OF THE INVENTION

The prior art commonly employs broadband integrated circuit IF amplifiers in radio communication receivers, with discrete frequency-selective filtering between the IF amplifiers. Typically, an integrated circuit detector immediately follows the final IF amplifier stage on a common silicon chip. Thus, there is virtually no practical method of filtering the final amplified IF signal just prior to its detection. In such cases, the noise reaching the detector from the final IF amplifier is relatively broadband noise, and the S/N ratio of the overall system is thus degraded by an amount proportional to the ratio of final stage amplifier bandwidth to the channel (or system) IF bandwidth. Especially where small signal levels are involved, this degradation in S/N may be critical.

One prior art solution is to place a large amount of the required overall gain ahead of the final integrated circuit amplifier (where it can still be passed through a relatively narrow band discrete frequency filter). This improves the signal-to-noise ratio by increasing the signal, not by reducing the noise. Readily apparent drawbacks to this solution include increased power requirements and increased cost. Alternatively, an extra noise band limiting filter could be employed prior to the detector, but this also increases cost and requires at least two extra package pins, thus increasing the cost and complexity of the integrated circuit.

Another (more sophisticated) prior approach to the problem involves improving the overall system's noise figure by controlling channel bandwidth. Examples of such prior art are:

U.S. Pat. No. 3,909,729—Baghdady (Sept. 1975)
U.S. Pat. No. 3,217,257—Boatwright (Nov. 1965)
U.S. Pat. No. 2,969,459—Hern (Jan. 1961)

In general, such prior art has relied on active feedback control loops to achieve variable channel bandwidth control for selected circuit areas. For example, the three above-cited patents all utilize this technique.

Any reduction in the final IF amplifier bandwidth will result in an improved S/N figure and thus reduce the amount of IF gain required ahead of the final IF amplifier. This is a desirable result (insofar as S/N alone is concerned) because it allows the IF gain and filtering to be concentrated, reduces the number of circuits required, and thus the size and cost of the receiver.

It is therefore highly desirable to reduce the final IF stage of integrated circuit amplifier bandwidth at low signal levels where noise considerations are most important. Since inductors and very large capacitors are very difficult to realize in integrated circuit form, simple resistance/capacitance (R/C) time constants are preferred to tuned RLC (resistance/inductive/capacitance) circuits.

At higher signal levels noise is less important but distortion caused by amplitude-to-phase conversion can be a problem. This problem will be compounded by any added capacitance (e.g. of the bandwidth reduction circuitry), since varying drive to the transistors in any stage will then cause greater variation in the detector output waveform due to reduced slew-rate capability.

BRIEF SUMMARY OF THE INVENTION

The ideal solution comprises an adaptive bandwidth reduction technique for the final IF amplifier stage which is level sensitive and such is provided by the present invention.

One feature of the present invention which permits automatic adaptive signal level-sensitive control of an IF amplifier stage (without need of an active feedback control loop) is use of the well known "Miller" effect in conjunction with individual cascaded self-limiting amplifier stages.

The present invention automatically reduces the bandwidth of an amplifier at low signal levels (where noise is of the utmost consideration). The adaptive feature can be considered to increase the IF amplifier bandwidth at higher signal levels and/or to reduce such bandwidth at lower signal levels. Noise levels are of less consideration at higher signal levels, but distortion due to amplitude-to-phase conversion is a consideration. Added capacitance of a conventional bandwidth-reducing circuit will compound amplitude-to-phase conversion distortion (owing to inherent consequences of the increased capacitance). By automatically operating with reduced capacitance (at higher signal levels), the present invention can reduce this amplitude-to-phase conversion problem as it simultaneously solves the S/N problem for lower signal levels.

A multi-stage cascaded self-limiting amplifier configuration utilizes the Miller-effect with respect to each stage so as to reduce the actual "on-chip" capacitance requirements. At least the latter stages of the chain are driven into a self-limited lowered gain state during high signal level periods, thus achieving the desired level-sensitive adaptive behavior of the IF amplifier as will be explained in more detail below.

In attempting to reduce bandwidth of integrated circuit amplifiers with "on-chip" capacitance, much silicon area will be consumed unless capacitance multiplication is employed. If the "Miller" effect is exploited, not only is the total capacitance requirement reduced, but, if the gain stage employed is a limiting stage the necessary adaptive behavior results.

The most sensitive stage for amplitude modulation (AM) to phase modulation (PM) conversion distortion in an FM receiver is the last non-limited IF stage (because it produces the largest variable output voltage swing). Since, with this invention the last stage(s) have reduced input capacitance at higher signal levels, the slew rate limitation is improved and the degree of amplitude-to-phase conversion distortion is minimized.

In this way an adaptive bandwidth is achieved with simplicity and with minimum silicon (or other semi-conductor) real estate.

The exemplary embodiment employs a cascade of self-limiting amplifiers, each having a small Miller effect feedback capacitance (e.g., an enhanced collector-to-base capacitance $C_{cb}$) between its input and its output. The result is an amplifier with adaptive bandwidth which automatically increases as input signal level increases and thus provides a good S/N figure while simultaneously retaining excellent AM to PM distortion rejection.

Such an amplifier finds application, for example, in integrated IF amplifier/detector circuits for FM radio receivers.

For the amplifier stages utilized, it will be shown that the bandwidth of each stage varies in inverse proportion to the input capacitance associated with that stage. And, the Miller effect input capacitance of such an individual stage automatically varies in accordance with its associated input signal level.

Accordingly, with a low signal level present, the bandwidth is reduced, as is desired since noise is a greater concern with low signal levels. Conversely, during high signal levels, the bandwidth of the IF amplifier stage is automatically increased. This desired adaptive behavior is automatic and achieved without need of an active feedback control loop in the exemplary embodiment.

BRIEF DESCRIPTION OF THE DRAWINGS

The following is a detailed description of a presently preferred exemplary embodiment in conjunction with the accompanying drawings, in which:

FIG. 2 is a schematic equivalent circuit diagram of multi-stage cascaded IF amplifier in accordance with the present invention and as also depicted more generally in FIG. 1;

FIG. 3 is a low-signal-level equivalent of the circuit depicted in FIG. 2;

FIG. 4 is a high-signal-level equivalent of the circuit depicted in FIG. 2;

FIG. 5 shows a simplified but more detailed schematic equivalent circuit diagram of two of the individual self-limiting amplifier stages of FIG. 2;

FIGS. 6 through 9 are further various equivalent explanatory circuits for the circuit depicted in FIG. 5;

FIG. 10 is a schematic electrical circuit diagram for a suitable transistor having enhanced $C_{cb}$ capacitance across its input/output; and FIG. 11 is a schematic depiction of an exemplary semiconductor integrated circuit geometry which may be used to realize the transistor of FIG. 10.

DETAILED DESCRIPTION OF AN EXEMPLARY EMBODIMENT

Figure 1:
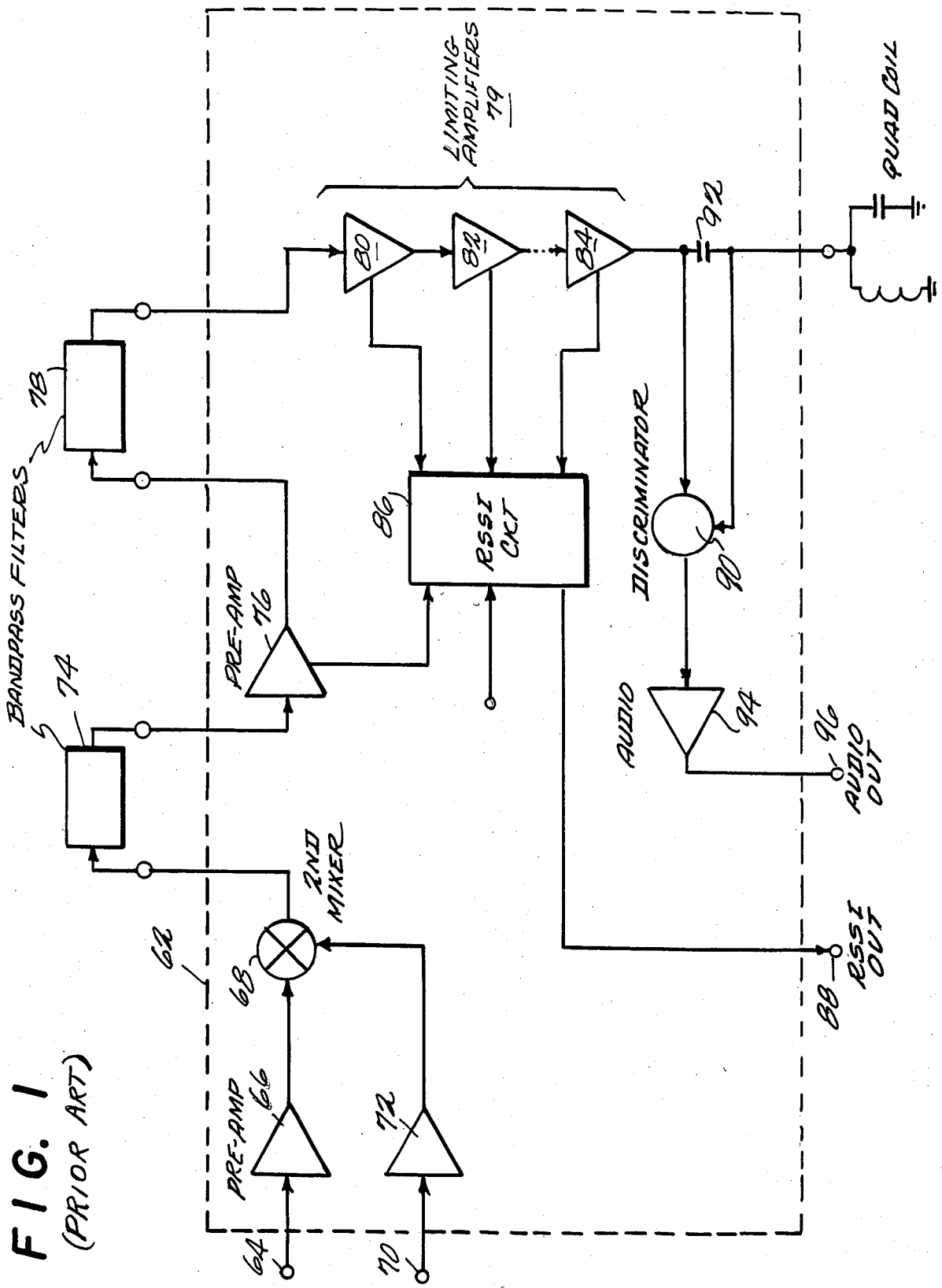
FIG. 1 is a schematic diagram of a typical IF amplifier/detector FM radio receiver circuit in which this invention may be employed.

In FIG. 1, 62 schematically represents an integrated circuit IF amplifier/detector FM radio receiver circuit, shown with the present invention, having a first IF signal at input 64 of, typically, about 45 MHz. This IF signal is fed through IC pre-amp 66, and then an IC local oscillator/mixer circuit 68. The local oscillator signal from input 70 (e.g. about 44.5 MHz in this embodiment) is passed by IC pre-amp 72 before feeding to the second IF mixer 68. The output of mixer 68 conventionally includes the difference and the sum of the two input frequencies thus presenting a second IF signal (e.g. 45−44.5=0.5 MHz). This mixer undergoes "outside" filtering through a discrete bandpass filter 74 disposed external to IC 62. After another pre-amp stage 76 (back "in" the IC 62), the second IF signal is submitted to a second discrete IF bandpass filter 78, "outside" the IC 62 before entering the "final" IF amplifier 79 (including stages 80, 82 . . . 84).

Collectively, the amplifier stages 80, 82 . . . 84 (five in the exemplary embodiment) are shown in FIG. 2. A conventional receive signal strength indicator (RSSI) circuit 86 (a device which receives inputs from amplifier stages) may have an output 88 which may typically be connected to some sort of indicator device, e.g., meter, viewable by the radio receiver user and/or used by the radio control circuits. The output of stage 84 is fed to a conventional FM discriminator 90 (which is typically in parallel with a capacitor 92 and a quad coil 93). Discriminator 90 conventionally outputs to audio amplifier 94 which is, in turn, connected to an audio output 96.

In FIG. 2, a series of five cascaded operational amplifiers 10 through 18 (corresponding to amplifiers 80, 82 . . . 84 in FIG. 1) are shown in accordance with one exemplary embodiment of the present invention. Input signal source 20 serves as an input to the first cascaded amplifier 10. Each operational amplifier has a generalized gain of A. Additionally, each stage has its own equivalent parallel capacitance 22–30, indicated with a value of C. For each stage of FIG. 2, the gain A is normally greater than 1 (unless the amplifier is driven into its self-limiting region of operation where A≅1). Collectively, all stages 10–18 of FIG. 2 constitute the final stage intermediate frequency amplifier 79, as depicted in FIG. 1.

FIG. 3 is a low-signal-level equivalent drawing of IF amplifier 79. The equivalent circuit of FIG. 2 is obtained by analyzing the "Miller" effect capacitances 22–30 for FIG. 2. The Miller-effect is a well known phenomenon whereby feedback capacitance connected across an operational amplifier stage (i.e. from its output to its input terminal) may be represented by a larger ("amplified") input capacitance to ground on the same stage. (Reference may be made to *Integrated Electronics,* Millman and Halkias, pp. 529–531.) Input capacitors 32–40 of FIG. 3 thus represent the enhanced Miller-effect input capacitances for capacitances 10–18 of FIG. 2. Keeping in mind that generalized expressions are being used, the equivalent Miller-effect input capacitance of each C is equal to A'C. The expression for A' would be:

$$A' = (1 - A) \qquad (1)$$

However, since the actual gain in the present invention of stages 10 through 18 is represented by −A, the expression for A' becomes:

$$A' = (1 + A) \qquad (2)$$

Thus, the Miller-effect capacitance for each stage varies in accordance with the absolute value of its signal transfer gain A. If all amplifying stages 10 through 18 have a gain A substantially in excess of 1, it is seen that the input capacitance of each stage is increased and this will be shown to reduce the bandwidth of these associated amplifier stages (as compared to self-limiting stages having lower gain).

FIG. 4 is a high-signal-level equivalent drawing of the FIG. 2 circuit to help demonstrate the adaptive technique of the present invention. Operational amplifiers 14 through 18 are assumed to be automatically driven by higher signal levels into a self-limiting condition. As is known (see *Integrated Electronics, supra,* page 511), the gain A of stages 14 through 18 will be effectively only unity while they are driven into this self-limiting condition (i.e., A≅1). Because the Miller-effect capacitance varies in accordance with the amplifier gain A (as shown above), Miller-effect input capacitances 36 through 40 have a value much lower than in the low-signal-level equivalent circuit of FIG. 3. Due to such relatively decreased Miller capacitance, the bandwidth of these latter stages of the IF amplifier is relatively increased. This relationship of bandwidth to capacitance will be further explained below with reference to FIGS. 5-9.

To summarize FIGS. 2 through 4, an adaptive IF amplifier is provided so that, during low signal level occurrences (FIG. 3), the bandwidth of the final IF amplifier stage is automatically reduced to improve the overall S/N figure. Note that the bandwidth of the IF amplifier may still be much broader than the effective channel bandwidth (as determined by the discrete frequency filters). During high signal level occurrences (FIG. 4), the amplifier bandwidth is relatively increased (to improve the slew rate of the IF stages and minimize the degree of amplitude-to-phase conversion distortion), while not deleteriously affecting the overall S/N figure for the receiver because of the relatively higher signal component.

FIG. 5 is a simplified equivalent drawing of two of the three stages 14-18 which are driven into self-limiting during high-signal-level occurrences. The amplifiers are illustrated as differential amplifiers 42 and 44, stages 1 and 2, respectively. Load resistors $R_L$ (46 through 52) and collector-to-base capacitances $C_{cb}$ (54 through 60) are shown for each transistor.

Diagramming a further equivalent circuit for stages 1 and 2 of FIG. 5 yields the input/output circuits shown in FIG. 6. In FIG. 6, the gain of each amplifier stage is shown to be $-A$. The differential amplifiers 42 and 44 of FIG. 5 have been resolved into their respective equivalent current sources and connections. Further equivalent circuit analysis may be made.

For example, applying Miller's theorem to the equivalent circuit of FIG. 6 (see *Integrated Electronics, supra*, pp. 255 and 256) and assuming $R_{in}$ to be much greater than $R_L$, the circuit shown in FIG. 7 is obtained. The Miller's theorem circuit of FIG. 7 is derived by a well known simplification technique which is self-explanatory with reference to the textbook material cited.

The progression of equivalent circuits from the limiting amplifier stages 42 and 44 of FIG. 5 may continue by applying Norton's theorem (see *Integrated Electronics, supra*, pp. 250 and 251) to the output of stage 1 of FIG. 7 to yield the equivalent circuitry of FIG. 8 wherein the expression for capacitance $C_2$ becomes:

$$C_2 = C_{cb}(1 + A + A/(A+1)) \quad (3)$$

If the gain A is large, then $C_2 \simeq C_{cb}(A+2)$.

Finally, through a straightforward analysis of the currents flowing in FIG. 8, an equivalent circuit of a single ended stage as shown in FIG. 9 may be established. FIG. 9 includes an RC network having a low pass filter response with a pole at:

$$f_p = \tfrac{1}{2}\pi R_L C_2. \quad (4)$$

In one embodiment, a single-pole low-pass amplifier was selected, for example, to have a 3 dB bandwidth of $f_p$. This occurs where $f/f_p = 1$. Five similarly cascaded stages would have a total 3 dB bandwidth occurring at $0.385\,f_p$.

It is thus seen that the bandwidth of the overall IF amplifier 79 is inversely proportional to the value of capacitance $C_2$. The adaptive behavior of the present invention thus automatically occurs if $C_2$ varies in accordance with signal level. The foregoing analysis of FIGS. 2 through 4 has already shown that the Miller-effect capacitances 32 through 40 of the present invention do indeed vary in accordance with signal level. Thus, the bandwidth of the amplifier 79 is varied automatically in accordance with the signal level as desired.

Referring to the block diagram of FIGS. 2 through 4, it has been shown (through the analysis depicted in FIGS. 5-9) that the total system bandwidth of amplifier 79 is $0.385\,f_p$. Typically none of the five stages of amplifier 79 were selected to be driven to self-limiting if the input signal level is less than a predetermined amount. (See *Integrated Electronics, supra*, page 511, for a transfer characteristic of a differential amplifier of the type shown.) As the signal level is increased beyond this amount, the stages of the overall IF amplifier 79 (amplifiers 14-18) are progressively driven into self-limiting operation, and the capacitances of these stages due to Miller-effect equivalent capacitance (capacitors 36 through 40) are greatly reduced from their previous values. This causes the pole associated with the amplifier outputs to increase as the capacitance decreases (see equation (4), supra). Decreasing the Miller-effect capacitance to a minimum moves the pole associated with amplifier 79 out further in frequency than its previous minimum bandwidth value.

Accordingly, the adaptive behavior of the present invention may automatically increase the bandwidth of amplifier 32 as the input signal level increases. This adaptive behavior is achieved through exploitation of the Miller-effect or multiplied input capacitance at each stage which is dependent upon the input signal level present in the cascaded self-limiting stages of the amplifier. Without use of the Miller-effect multiplied capacitance, a very large capacitance would have to be provided "on-chip" through conventional techniques in order to achieve the present reduced bandwidth at low signal level occurrences, thereby presenting numerous practical problems.

The naturally occurring collector-to-base capacitance ($C_{cb}$) is preferably enhanced both by the transistor's integrated circuit geometry and through the Miller-effect in order to achieve the requisite adaptive behavior. As has been shown, the present invention operates to adaptively control the bandwidth of a cascaded multi-stage IF amplifier. The bandwidth concerned is still wide compared to the channel bandwidth defined by external filters prior to the last IF amplifier stage. Accordingly, this adaptive bandwidth technique effectively reduces the broadband noise contribution of the IF amplifier without changing or impacting the channel bandwidth.

FIG. 10 schematically shows a suitable transistor, for use with the present invention, having enhanced naturally-occurring collector-to-base capacitance ($C_{cb}$) sufficient to achieve the required bandwidth control.

FIG. 11 is a schematic example of semiconductor geometry which can be used to achieve the transistor of FIG. 10. Both FIGS. 10 and 11 show that extra capacitance may be added, for example, by including additional relatively large area parallel emitters (e.g., E2 and E3) connected to the collector in the transistor configuration. The naturally-occurring capacitance associated with the extra emitter-to-collector connections adds in parallel with the collector-to-base capacitance to increase the total effective capacitance $C_{cb}$. The capacitors shown in dotted line in FIG. 11 are representative of these various naturally-occurring capacitances within such a transistor configuration of "parallel plate" structures.

The present invention has been shown to provide "on-chip" adaptive behavior within an IF amplifier in a single integrated circuit package. Such has been described with reference to the foregoing exemplary embodiment. However, those skilled in the art will recognize many variations and modifications which may be made without departing from the novel features and advantages of the present invention. All such modifications and variations are to be included within the scope of the appended claims.

What is claimed is:

1. An adaptive bandwidth FM IF amplifier for use in an FM receiver to amplify IF frequency modulated signals having an expected range of varying amplitude, comprising:
   an input port,
   an output port,
   two or more amplifier stages having respective input and output nodes connected in cascade between said input and output ports, said amplifier stages being arranged to be gain-saturated when processing IF signals having amplitude levels in an upper portion of said expected range; and
   adaptive means associated with each amplifier stage for automatically varying the effective signal transmission bandwidth from said input to said output port as a function of the amplitude of a signal applied to said input port as gain-saturation occurs in at least one of the cascaded amplifiers.

2. An adaptive bandwidth FM IF amplifier in accordance with claim 1, wherein
   each said adaptive means is automatically responsive to the signal level input to its respective amplifier to automatically decrease said bandwidth as such signal level becomes lower, and to automatically increase said bandwidth as the signal level becomes higher.

3. An adaptive bandwidth FM IF amplifier as in claim 1, wherein
   each said adaptive means comprises a capacitance disposed between the input and output node of its respective amplifier stage.

4. An adaptive bandwidth FM IF amplifier as in claim 3, wherein
   each said adaptive means comprises Miller-effect input capacitance to vary said bandwidth in response to the input signal level present at its respective amplifier.

5. An adaptive bandwidth FM IF amplifier as in claim 3, wherein
   said capacitance is varied in response to the signal level present in the amplifier, said variation being due to the Miller-effect and to a self-limiting amplification gain factor associated with each amplifier stage.

6. An adaptive bandwidth FM IF amplifier as in claim 1, wherein
   at least the last one of said cascaded amplifier stages has a self-limiting amplification factor due to the fact that it is driven into a limited gain condition in response to relatively higher input signal levels.

7. An adaptive bandwidth FM IF amplifier as in claim 3, wherein
   said cascaded amplifier stages and said capacitance means are all contained within a single integrated circuit package.

8. An adaptive bandwidth amplifier for use to amplify frequency modulated signals having an expected range of varying amplitude, said amplifier comprising:
   an input port and an output port;
   multiple amplifier stages connected in cascade and joining said input port with said output port, at least one of said amplifier stages being arranged to have a self-limiting amplification factor in the presence of input signals having amplitudes in a higher portion of said expected range; and
   multiple capacitances, at least one of which capacitances is effectively connected across each one of said said amplifier stages to provide Miller-effect input capacitance of an amount which varies with the degree of said self-limited amplification factor.

9. An amplifier as in claim 8, further comprising:
   an FM detector connected to the output port whereby said amplifier provides the final IF signal amplification prior to detection in an FM radio receiver.

10. An amplifier as in claim 8, wherein
    at least the last stage of said cascaded amplifier stages operates in a self-limiting mode when the signal level input to that amplifier stage increases beyond predetermined levels, whereby the cascaded amplifier stages automatically function to adapt the bandwidth of said amplifier to varying input signal levels.

11. A method of optimizing the signal/noise ratio of the IF amplifier/detector stages of an FM receiver, said method comprising the steps of:
    automatically increasing the Miller-effect capacitance associated with the IF amplifier, and thereby reducing the bandwidth of the IF amplifier, whenever the input IF signal level is below a predetermined value; and
    automatically decreasing the Miller-effect capacitance associated with the IF amplifier, and thereby increasing the bandwidth of the amplifier, whenever the input IF signal base is above a predetermined value.

12. A method as in claim 11, wherein
    said automatically decreasing the capacitance step includes driving at least the last of the cascaded amplifier stages in a self-gain-limiting mode in response to relatively higher input signal levels; and
    said automatically increasing the capacitance step includes driving at least the last of the cascaded amplifier stages in a non-limiting gain mode in response to relatively lower input signal levels.

13. A method as in claim 11, wherein
    said Miller-effect capacitance varies in relation with the effective gain of the cascaded amplifier stages.

14. A method as in claim 11, wherein
    said bandwidth reduction is an automatic and direct consequence of operating cascaded plural self-limiting amplifier stages, each having a Miller-effect capacitance, without any feedback control loops across the complete set of cascaded amplifiers.

15. An integrated circuit IF amplifier/detector for an FM radio receiver, said integrated circuit comprising:
    a cascaded plurality of self-gain-limiting IF amplifier stages, each of said stages including a Miller-effect input capacitance and means for providing an effective transmission frequency of an associated amplifier stage as a predetermined function of input IF signal levels; and an FM detector circuit connected to receive an input IF signal from the last one of said cascaded IF amplifier stages.

16. An amplifier/detector as in claim 15, wherein each said Miller-effect input capacitance varies proportionately with the changes in the effective gain of its associated amplifier stage; and the effective transmission frequency bandwidth of each amplifier stage varies inversely proportionately with its associated Miller-effect input capacitance.

17. A signal-level sensitive adaptive bandwidth amplifier, comprising:

a cascaded plurality of self-gain-limiting Miller-effect amplifier stages each of which includes a Miller-effect input capacitance, and therefore an effective transmission frequency bandwidth, which varies with changes in the effective gain of its associated amplifier stage as a predetermined function of input signal levels.

18. An adaptive bandwidth amplifier as in claim 17, wherein each said Miller-effect input capacitance varies proportionately with the changes in the effective gain of its associated amplifier stage; and the effective transmission frequency bandwidth of each amplifier stage varies inversely proportionately with its associated Miller-effect input capacitance.

* * * * *